United States Patent
So et al.

[19]

[11] Patent Number: 5,883,410
[45] Date of Patent: Mar. 16, 1999

[54] EDGE WRAP-AROUND PROTECTIVE EXTENSION FOR COVERING AND PROTECTING EDGES OF THICK OXIDE LAYER

[75] Inventors: Koon Chong So, San Jose; Fwu-Iuan Hshieh, Saratoga; Danny Chi Nim, San Jose; Yan Man Tsui, Union City, all of Calif.

[73] Assignee: MegaMOS Corporation, San Jose, Calif.

[21] Appl. No.: 874,357

[22] Filed: Jun. 13, 1997

[51] Int. Cl.$^6$ ............................ H01L 29/79; H01L 29/94; H01L 31/062; H01L 31/113
[52] U.S. Cl. ............................................ 257/329; 257/333
[58] Field of Search ....................................... 257/329, 333

Primary Examiner—Stephen D. Meier
Attorney, Agent, or Firm—Bo-In Lin

[57] ABSTRACT

The present invention discloses a power transistor disposed on a substrate. The power device includes a core cell area comprising a plurality of power transistor cells each having drain and a source. Each of the power transistor cells further having a polycrystalline silicon gate formed on the substrate as part of a polycrystalline silicon gate layer overlaying the substrate. The polycrystalline silicon gate layer includes a plurality of polycrystalline gate-layer-extension extending to gate contact areas for forming gate contacts with a contact metal disposed thereon. The power transistor further includes a plurality of contact-metal-resistant pad each includes a thick oxide pad disposed below the gate contact areas underneath the polycrystalline gate layer extension whereby the contact-metal resistant pads resists the contact metal from penetrating therethrough and short to the substrate disposed thereunder.

9 Claims, 8 Drawing Sheets

EDGE WRAP-AROUND PROTECTIVE EXTENSION FOR COVERING AND PROTECTING EDGES OF THICK OXIDE LAYER

BACKGROUND OF THE INVENTION

1. Field of the Invention

This invention relates generally to the structure and fabrication process of semiconductor power transistors. More particularly, this invention relates to a novel and improved polysilicon-oxide layer structure in the termination area of a power to eliminate defects in the oxide layer whereby the reliability difficulties and product yield problems caused by oxide layer defects may be resolved.

2. Description of the Prior Art

Device performance and production yield in manufacturing the power MOSFET devices are adversely affected by the inherent vulnerable spots typically occurred near the bottom edges of a thick oxide layer where the thick oxide layer disposed immediately adjacent to a thinner gate oxide. The inherent vulnerability at these thick-thin oxide layer intersection points is caused by a stress induced from thermal expansion differences during the temperature cycles occurred in manufacturing the MOSFET device. Subsequently, small cracks or layer peeling-off at these vulnerable spots are subject to further damages when exposed to etchants in patterning the gates. Furthermore, processing residual are likely to be trapped in the cracks or holes formed in the vulnerable spots thus contaminating the MOSFET device and causes a performance degradation.

Figure 1A:
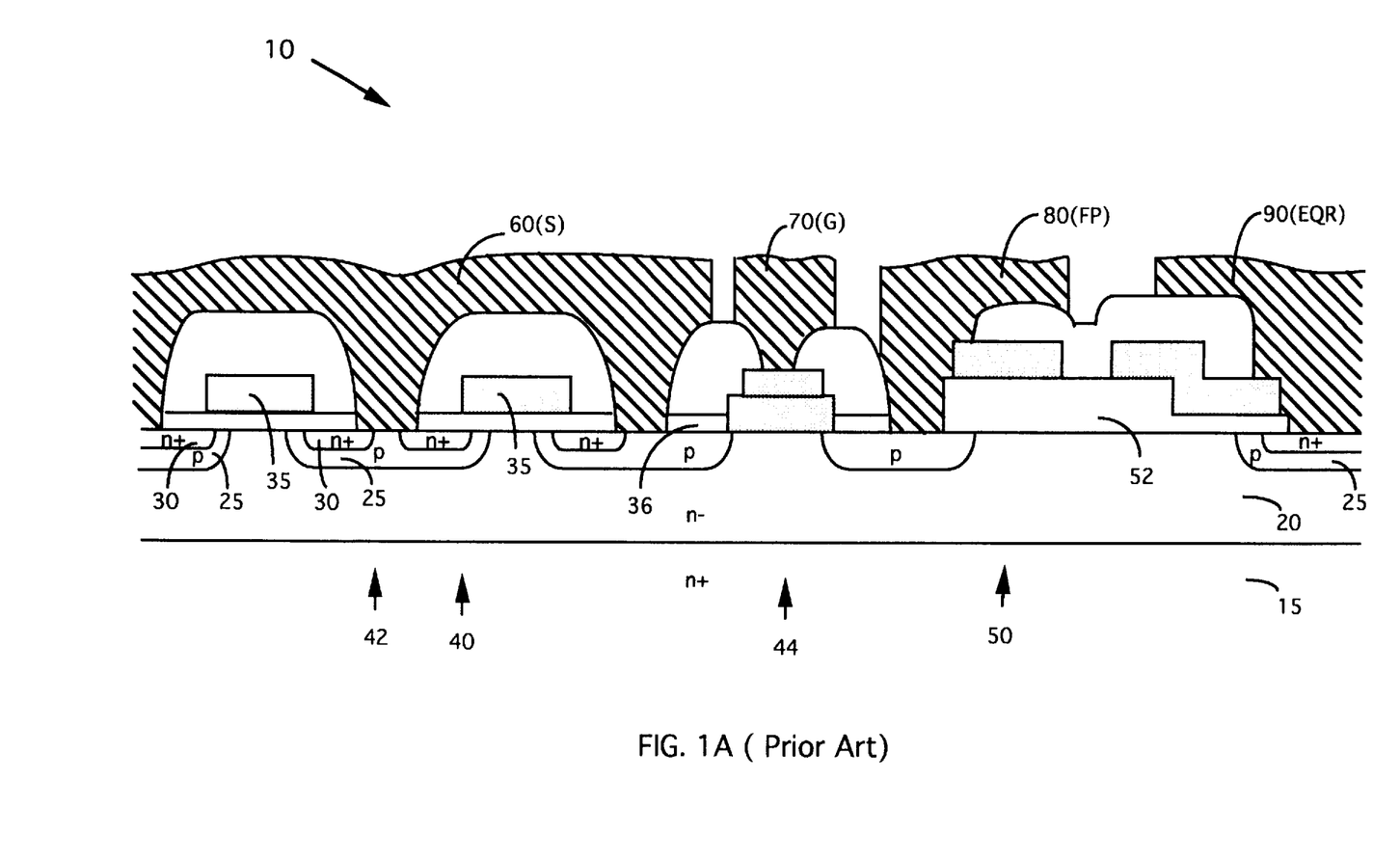
FIGS. 1A and 1B are cross sectional views of a prior art layer structure of thick oxide near the termination area for a general MOSFET device.
Figure 1B:
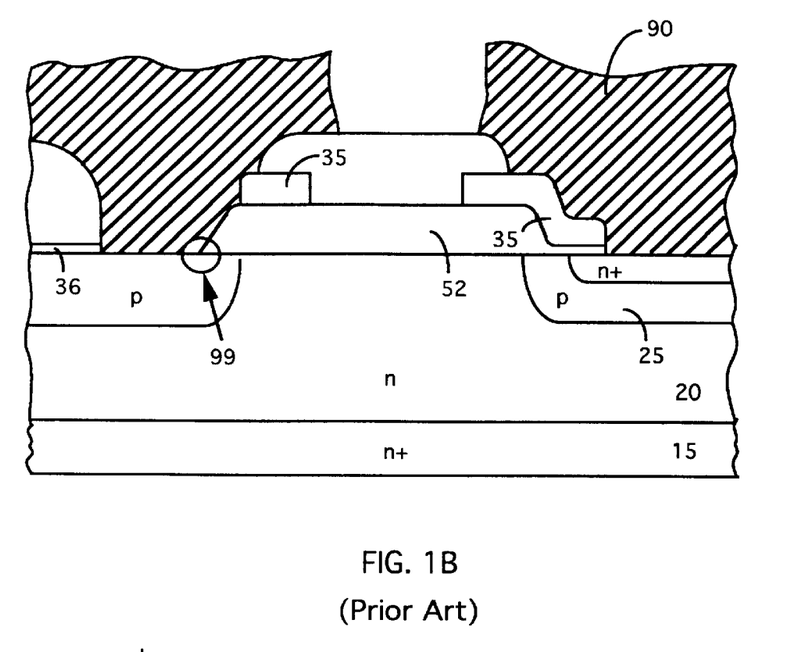
Figure 1C:
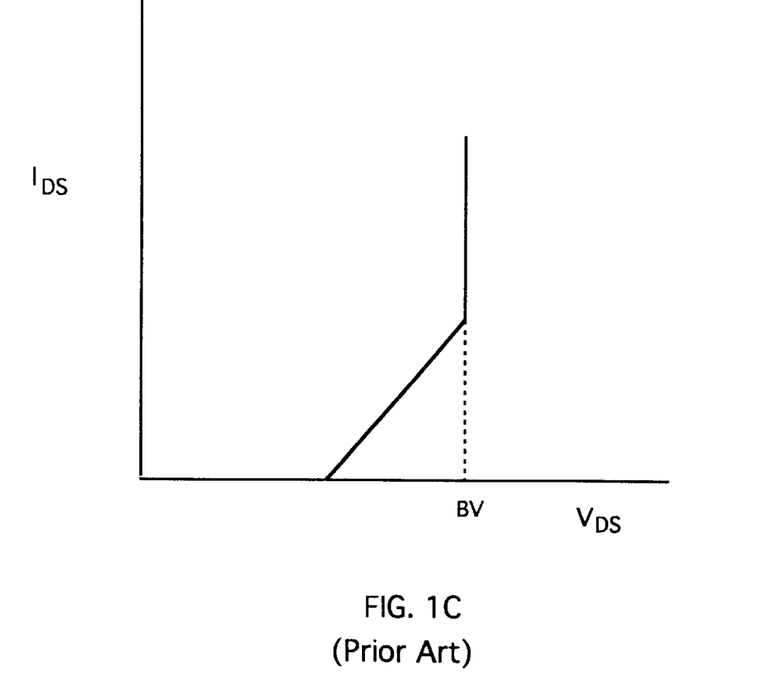
FIG. 1C is a diagram showing the drain to source leakage current when there are damaged and contaminated thick oxide layer near the termination area for the prior devices shown in FIGS. 1A and 1B.

Referring to FIG. 1A for a typical cross sectional view of a power MOSFET device. This conventional N-channel MOSFET device 10 is supported on a n$^+$ substrate 15 with a n$^-$ doped epitaxial drain region 20 formed thereon. A plurality of p-body regions 25 and n$^+$ source regions 30 are formed on top of the drain region 20 as shown. The MOSFET device 10 is divided into an active area 40 which includes a core cell area 42 and a gate contact area 44. The MOSFET device 10 further includes a field oxide area 50. A plurality of cells which include the p-body 25, the source regions 30, and a polysilicon gate 35 are formed in the core cell area 42 padded by a thin oxide layer 36. As shown in FIG. 1, the source electrode (S) 60 is formed in the core cell area 42 and the gate runner (G) 76 and the gate contacts 70 are formed in the gate contact areas 44 in the active area 40 near the field oxide areas 50. The field plate (FP) 80 and the equal ring (EQR) 90 are formed in the filed oxide area 50 where the field oxide layer 52 is not removed in the manufacturing process. FIG. 1B is an exploded cross sectional view of the portion near the thick oxide layer 52 in the termination area 50. Particularly, there are inherent weak points 99 around the intersection between the thick oxide layer 52 and the gate oxide layer 36. Due to the structure damage, a drain to source leakage current occurs as that shown in FIG. 1C. Fig. Due to this structural damage, an undesirable leakage current, i.e., I$_{DS}$, as that shown FIG. 1C, is experienced before a P-N junction avalanche breakdown occurs.

There are several reasons that damages are likely to occur near the weak points 99 where the thick oxide layer 52 joins the thinner gate oxide layer 36. An etch step is first applied for patterning the thick oxide layer i.e., the initial oxide layer 52 to remove the initial oxide layer 52 from the active area. Then a thinner gate oxide layer 36 is formed. The gate oxide layer 36 and initial oxide layer 52 have different thermal expansion coefficients because of the differences in thickness. Inherent vulnerable spots 99 are formed near the areas where the initial oxide layer 52 joins the thinner oxide layer. As the MOSFET transistor is subject to up-and-down temperature cycles, a stress is experienced in these vulnerable spots due to differences in thermal expansions in these thermal cycles. Micro-cracks or surface damages are likely to occur in these areas. After the formation of the thin gate oxide, polysilicon gates may be patterned by dry etch. Further damages to the edge surface near the bottom of the thick oxide layer may be induced when exposure to plasma etchants. The damaged surface with cracks and holes may then become traps for different kinds of processing residuals. The damaged areas thus become depository sites for contaminants. For those reasons, poor layer integrity of the thick oxide layer 52 has often occurred and the deposited contaminants also cause an undesirable drain to source leakage current.

Figure 2:
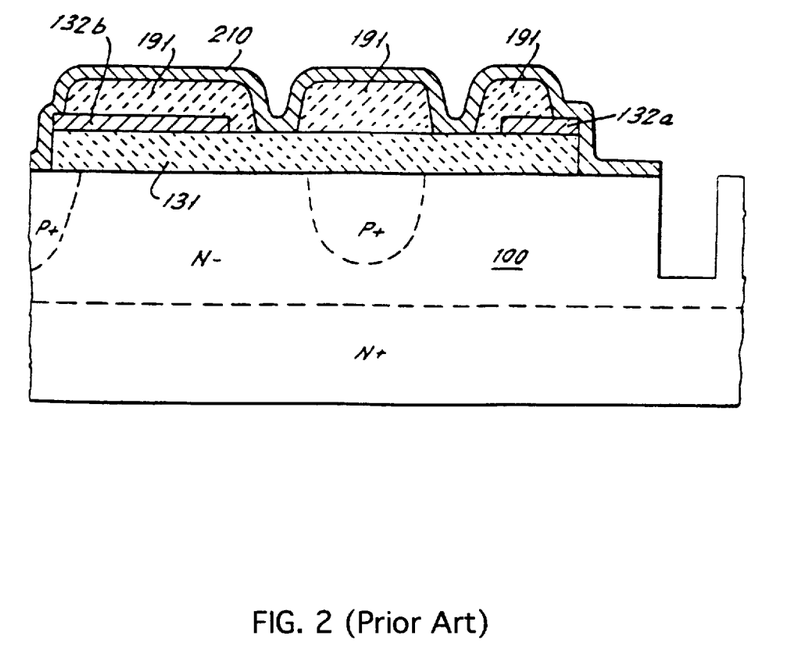
FIG. 2 is a cross-sectional view of a prior art thick oxide layer structure disclosed in a prior art Patent.

Conventional manufacture method does not provide a layer structural feature or method to overcome this difficulty. Typical layer structure near a terminal area is shown in FIG. 2 as that disclosed in U.S. Pat. No. 4,593,302 by Lidow et al. entitled "Process for Manufacture of High Power MOSFET with Lateral Distributed High Carrier Density Beneath the Gate Oxide" (issued on Jun. 3, 1986). FIG. 2 shows that a thick oxide layer 131 with a polysilicon layer 132b formed thereon near a termination area. The same difficulties as described above would also occur for the same reasons near the bottom portions of the thick oxide layer 131 in this patented layer structure by Lidow et al. Weak points susceptible to layer surface damages due to stress caused by different thermal expansions between thick and thin oxide layers and exposure to plasma etchant for gate formation are existing difficulties not properly addressed by those of ordinary skill in the art of power MOSFET device manufacture.

Therefore, a need still exists in the art of power device fabrication, particularly for semiconductor power device design and fabrication, to provide an improved gate structure and fabrication process that would resolve these difficulties.

SUMMARY OF THE PRESENT INVENTION

It is therefore an object of the present invention to provide an improved edge-protective layer structure to cover edges of thick oxide layers manufactured by applying masks with novel configurations in order to overcome aforementioned limitations and difficulties encountered in the prior art.

Specifically, it is an object of the present invention to provide an improved edge protection layer structure wherein a special polysilicon layer extended to wrap around edge of thick oxide layer is formed by employing a either specially configured initial oxide mask or polysilicon mask such that the weak points near the bottom of the thick oxide layer are covered and isolated such that they would not become contaminated by various processing residuals which may be deposited in the damaged edge surfaces surrounding the thick oxide layer such that device performance and production yield are not adversely affected.

Another object of the present invention is to provide an improved edge protective layer structure wherein a special configured polysilicon layer is extended to wrap around edges of thick oxide layer by employing either a specially configured initial oxide mask or polysilicon gate mask wherein the length of the wrapping around polysilicon layer is precisely controlled such that the weak points near the bottom of the thick oxide layer are isolated and a device walkout problem would not occur by controlling the length of the wrapping around layer extended over the gate oxide layer to be less than a lateral diffusion length of the body dopant.

Another object of the present invention is to provide an improved oxide layer structure wherein a special polysilicon wrapping around edge configuration is formed by employing either a specially configured initial oxide mask or a polysilicon mask wherein the length of the wrapping around is precisely controlled such that the cell size of the MOSFET transistor is not unduly affected and the length of the wrapping around edge polysilicon layer would not limit the shrinking of the MOSFET power device to achieve higher cell density.

Another object of the present invention is to provide an improved oxide layer structure wherein a special polysilicon wrapping around edge configuration is formed by employing either a specially configured initial oxide mask or a polysilicon mask such that the weak points near the bottom of the thick oxide layer are isolated and source to drain leakage current is eliminated without requiring more complicate manufacture process whereby power device with improved reliability and better performance characteristics can be obtained without increasing the production costs.

Briefly, in a preferred embodiment, the present invention includes a power transistor disposed on a substrate. The power device includes a core cell area and a termination area opposite the core cell area, the core cell area includes a plurality of power transistor cells each having drain and a source. Each of the power transistor cells further having a polycrystalline silicon gate disposed on top of the substrate. The polycrystalline silicon gate further includes a polycrystalline silicon gate-layer-extension wherein the gate-layer extension extends as a plurality of poly-fingers from the core cell area to the termination area. The power transistor further includes an initial oxide layer disposed under the polycrystalline silicon gate-layer-extension including the poly-fingers wherein the polycrystalline silicon gate layer extended over edges of the initial oxide layer to wrap around and cover edges of the initial oxide layer whereby structural damages on edges of the initial oxide layer are reduced. In a preferred embodiment, the power transistor further includes a gate oxide extension layer disposed adjacent to the initial oxide layer padded underneath the polycrystalline gate layer extension having an gate oxide extension width. The power transistor further includes a body region disposed under the gate oxide extension layer and the initial oxide layer doped with a body dopnat wherein the gate oxide extension width is shorter than a lateral diffusion length of the body dopant.

This invention further discloses a method for manufacturing a power transistor on a substrate. The method includes the steps of (a) forming an initial oxide layer on a top surface of the substrate and etching away the initial oxide layer to define an active area for manufacturing a plurality of transistor cells thereon; (b) growing a gate oxide layer in the active area followed by depositing a polycrystalline silicon gate layer thereon; and (c) applying a polysilicon gate mask for patterning a plurality of gates for each of the transistor cells and an edge wrap around polysilicon extension layer extended from the gates wherein the edge wrap around polysilicon extension layer is patterned to cover the initial oxide layer and extended over edges of the initial oxide layer to wrap around and cover edges of the initial oxide layer whereby structural damages on edges of the initial oxide layer are reduced. In a preferred embodiment, the step of patterning the edge wrap around polycrystalline silicon extension layer to wrap around edges of the initial oxide layer is a step of controlling a width of the gate oxide layer formed next to the initial oxide layer padded underneath the polycrystalline silicon extension layer to be shorter than a lateral diffusion length of a body dopant provided for forming a body region having a portion diffused underneath the gate oxide layer and the initial oxide layer.

These and other objects and advantages of the present invention will no doubt become obvious to those of ordinary skill in the art after having read the following detailed description of the preferred embodiment which is illustrated in the various drawing figures.

DETAILED DESCRIPTION OF THE PREFERRED EMBODIMENT

Figure 3A:
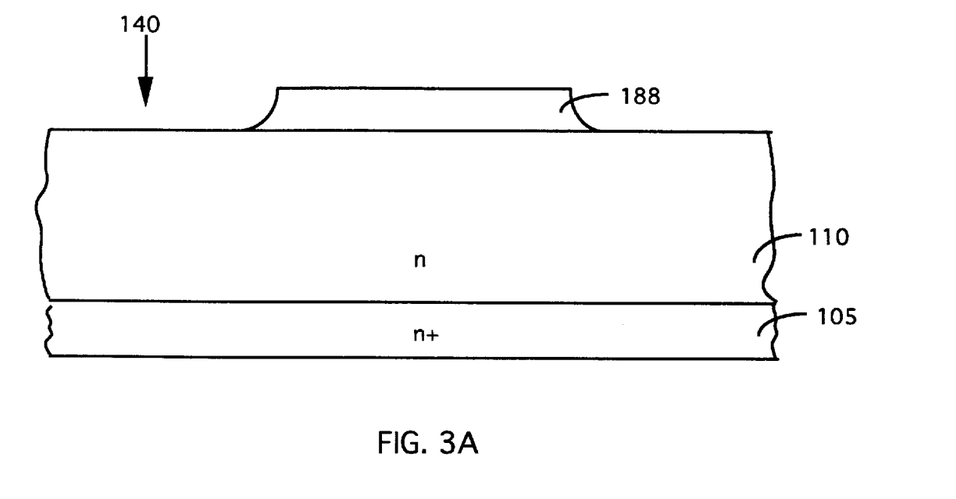
FIGS. 3A to 3B are cross sectional views to show a novel semiconductor power device manufacture processes with edge wrap around structure over edges of thick oxide layer according to a preferred embodiment of the present invention.
Figure 3B:
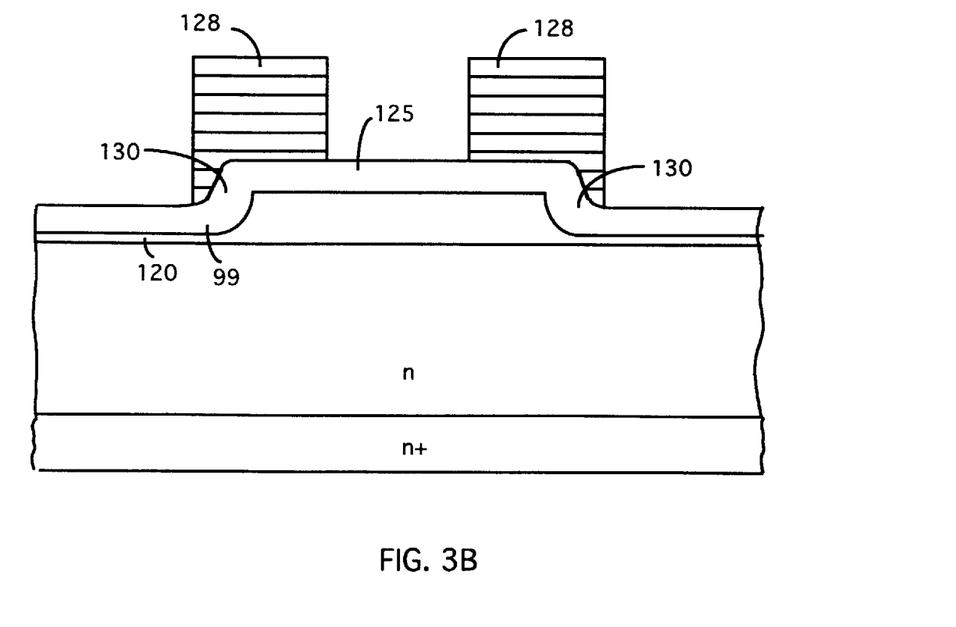

Please refer to FIGS. 3A to 3B for a series of cross sectional views to show the improved manufacture processing steps of the present invention. As shown in FIG. 3A, the processing steps begins by first growing a N epitaxial layer 120 with a resistivity ranging from 0.1 to 1.0 ohm-cm on top of a N$^+$ substrate 115. The substrate has a resistivity of 0.001 to 0.007 ohm-cm. The thickness and the resistivity of the epitaxial layer 120 depend on the requirements for device on-resistance and breakdown voltage. In a preferred embodiment, the thickness of the epitaxial layer 120 is about six to eight microns (6–8 $\mu$m). An initial field oxide layer 188 of thickness in the range of 3,000 to 10,000 Å is grown which is then etched by applying an active mask to define the active areas 140.

Referring to FIG. 3B, a gate oxidation process is first carried out to form a gate oxide layer 120 in the active areas 140. A polysilicon layer 125 is then deposited on the gate oxide layer 120 and over the initial field oxide layer 188. A POCL$_3$ doping process is carried out followed by an As-implant process with an ion beam of energy at 60–80 Kev with a flux density of 5 to 8+10$^{15}$/cm$^2$. A specially configured polysilicon gate mask 128 is then applied to carry out an anisotropic etching process to define the polysilicon gate 125. By applying this specially configured polysilicon gate mask, the polysilicon layer 125 over the initial field oxide layer 188 is patterned to form an edge wrap-around protective extension 130 over the initial field oxide 188. As shown in FIG. 3B, the specially configured mask 128 for etching the polysilicon gates 125 covers over the edge wrap-around protective extension 130 which extends beyond the edges of the thick initial field oxide layer 188 such that the edge wrap around protection extension is patterned to cover the weak points 99 near the bottom portion of the initial oxide layer 188. Because the weak points 99 are covered under the edge wrap-around protection extension 130, there would not be any damages caused by exposure to etchants.

As the weak points on the bottom edges of the thick oxide layer 188 are covered by the edge wrap-around protective extension 130, the contaminants produced from processing residuals as results from various subsequent fabrication steps are therefore not trapped in the cracks or micro-holes in those areas. Performance degradation, e.g., drain to source leakage currents, is therefore prevented. Subsequent processing steps such as the implantation and diffusion of the body regions, the source regions and the formation of the insulation layers and metal contacts for the MOSFET device are standard procedures and well known in the art. Further description of those steps are not necessary for the purposes of describing the main structural features of this invention.

Figure 4A:
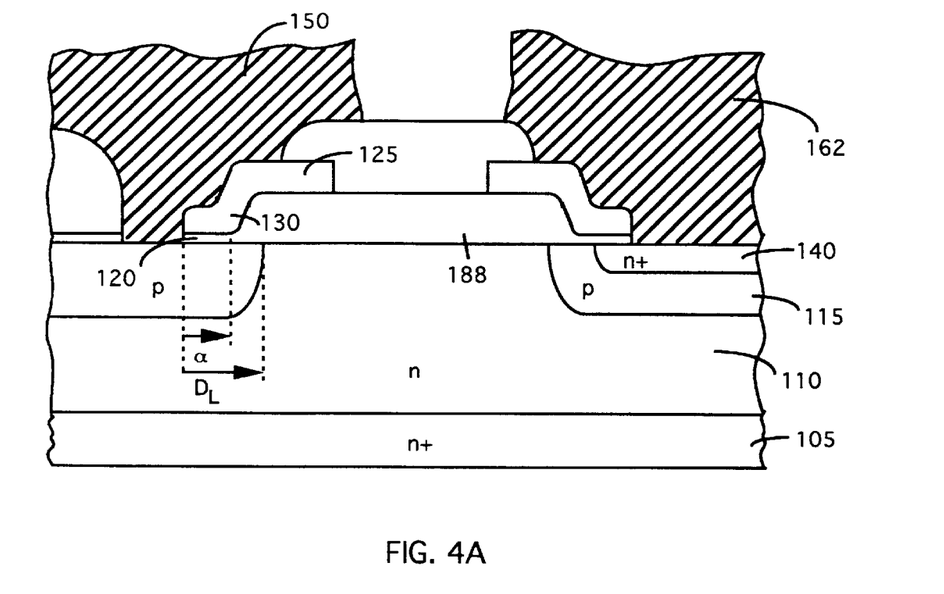
FIGS. 4A to 4D are cross sectional views and drain to source current variations with different lengths of the edge wrap-around protective extensions.
Figure 4B:
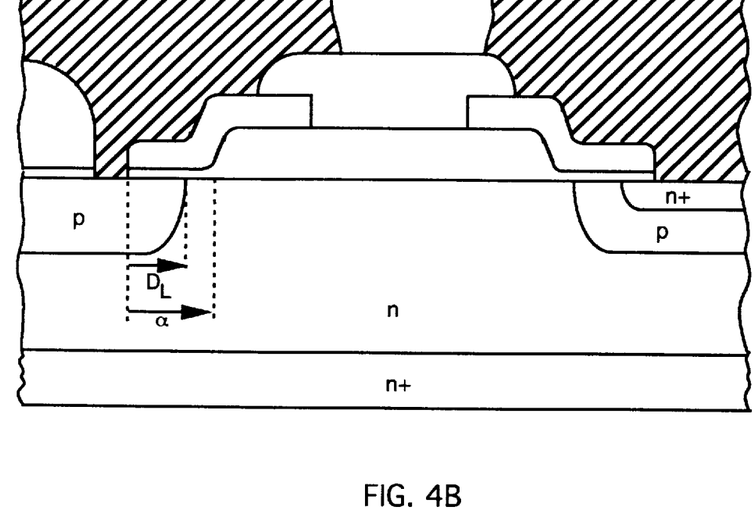
Figure 4C:
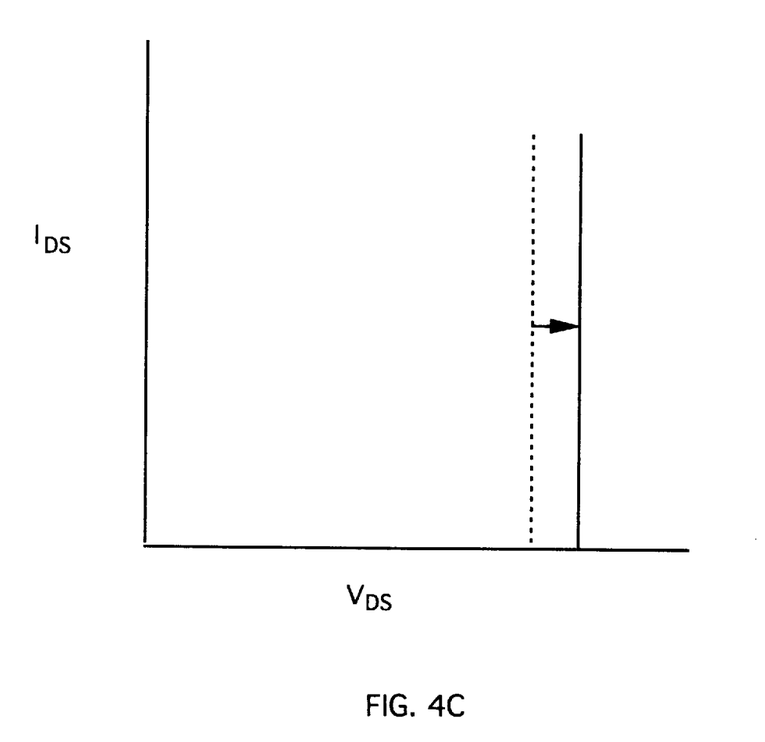

Referring to FIG. 4A for a cross section view for illustrating the design requirement for the length of the edge wrap around protective extension 130 as manufactured according to the steps shown in FIGS. 3A to 3B. As shown in FIG. 4A, the distance of the protective extension 130 which is formed above the thin gate oxide layer has a distance α. It is required that this distance α must be shorter than a lateral diffusion length $D_L$ of the body dopant. This requirement for the length of α to be less than the lateral diffusion of the body dopant is because of the design concern that if the length α of the extension 130 above the gate oxide 120 is greater than the dopant diffusion length $D_L$, an undesirable walkout phenomenon may occur. A higher drain to source voltage is required to induce a drain to source current. Referring to FIGS. 4B and 4C for the walk out problem when the length of the protective extension α is longer than the lateral diffusion length of the body dopant $D_L$. In order to avoid this walk out problem, the distance α must satisfy a requirement that:

$$D_L > \alpha > 0 \tag{1}$$

Figure 4D:
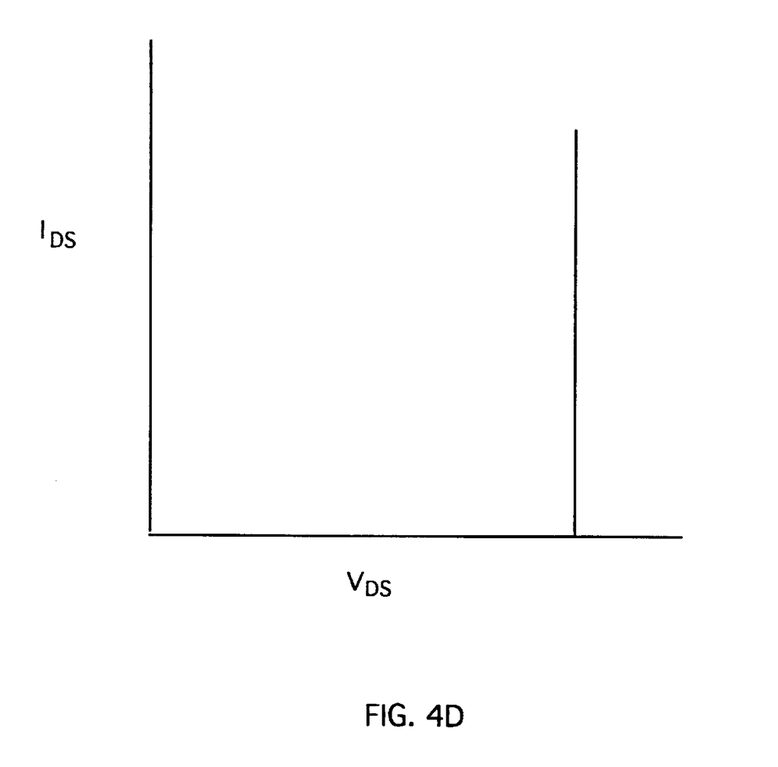

The distance α is determined by the tolerances of the critical dimension (CD) and the capability of the manufacture equipment to minimize the misalignment errors. When the requirement of Equation (1) is satisfied, the walkout problem is avoided as that shown in FIG. 4D. For the purpose of increasing the cell density of power MOSFET device, it is desirable to reduce the length of the protective extension such that the lateral dimension of the transistor cell is not limited by this extra extension. However, to protect the weak points 99 on the bottom edge of the thick oxide layer 188, the condition of α>0 must be satisfied. Once the weak points 99 are covered by the overlying protective extension 133 and that the distance of that extension is shorter than the lateral diffusion length $D_L$ of the body dopant, the difficulties caused by potential damages at the weak points 99 are resolved.

According to FIGS. 3A to 3D, this invention further discloses a method for manufacturing a power transistor 100 on a substrate 105. The method includes the steps of (a) forming an initial oxide layer 188 on a top surface of the substrate and etching away the initial oxide layer to define an active area 140 for manufacturing a plurality of transistor cells thereon; (b) growing a gate oxide layer 120 in the active area followed by depositing a polycrystalline silicon gate layer 130 thereon; and (c) applying a polysilicon gate mask 128 for patterning a plurality of gates for each of the transistor cells and an edge wrap around polysilicon extension layer extended from the gates 130 wherein the edge wrap around polysilicon extension layer is patterned to cover the initial oxide layer 188 and extended over edges of the initial oxide layer 188 to wrap around and cover edges of the initial oxide layer whereby structural damages on edges of the initial oxide layer are reduced. In a preferred embodiment, the step of patterning the edge wrap around polycrystalline silicon extension layer to wrap around edges of the initial oxide layer is a step of controlling a width of the gate oxide layer α formed next to the initial oxide layer 188 padded underneath the polycrystalline silicon extension layer 130 to be shorter than a lateral diffusion length of a body dopant $D_L$ provided for forming a body region 115 having a portion diffused underneath the gate oxide layer 120 and the initial oxide layer 188.

Figure 5A:
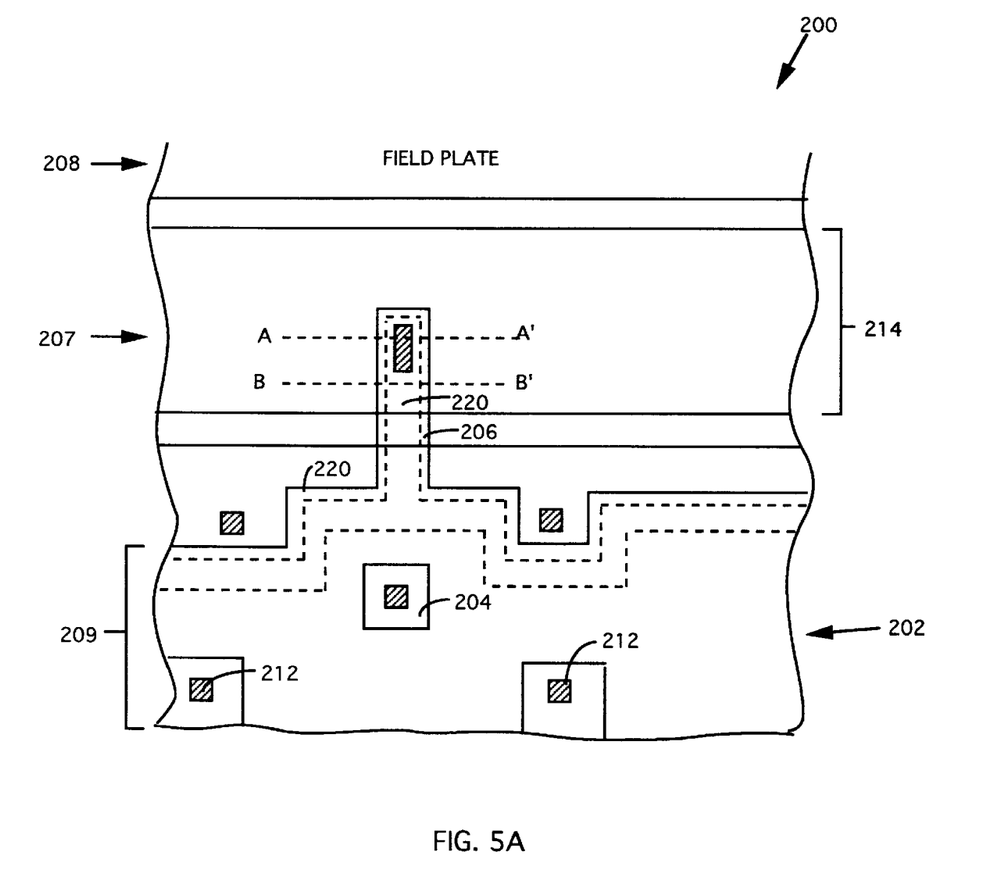
FIG. 5A is a top view of a MOSFET device showing the poly-finger extending from the core cell area to the peripheral of an active area in a preferred embodiment of the present invention.
Figure 5B:
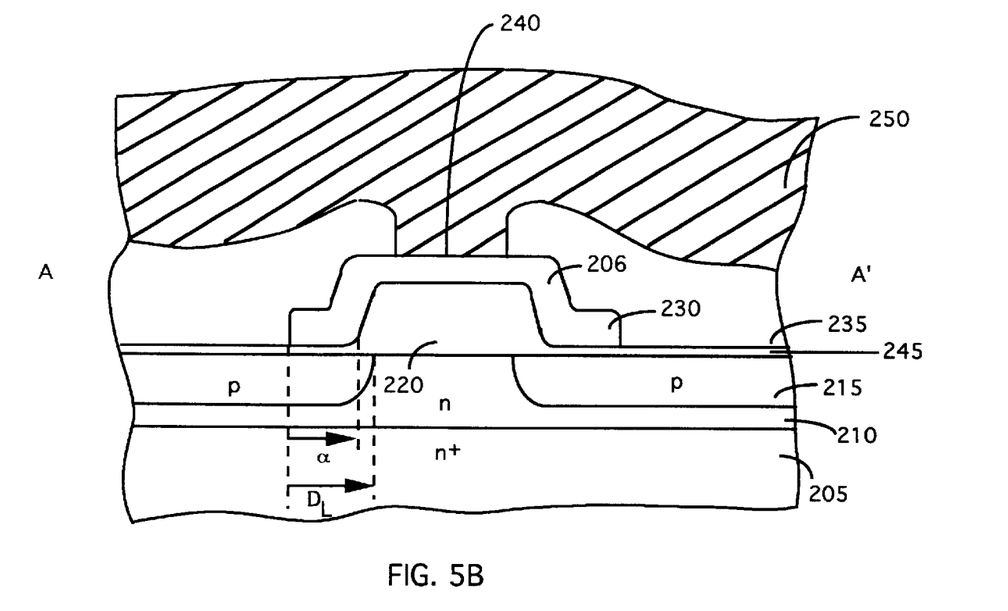
FIGS. 5B and 5C are cross sectional view of a MOSFET device of FIG. 5A.
Figure 5C:
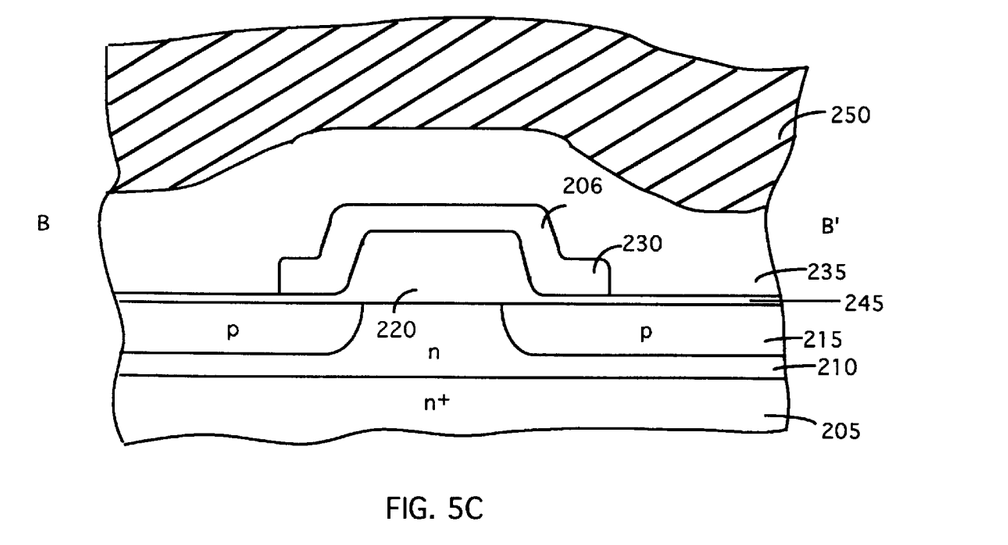

FIG. 5A shows a top view of a MOSFET device 200 implemented with a layer structure according to the present invention. The device 200 includes a core cell area 202 which has a plurality of transistor cells 204 formed therein. From this core cell area 202, a plurality of "poly-fingers" 206 which are polysilicon gate extensions extend toward an active-edge area 207 between the core cell area 202 and a termination area 208 on the device 200. A gate contact 240 is then opened on the end of the poly fingers 206. A source metal layer is formed on top of the core cell area 202 to cover an area marked as 209 to contact the source 212 for each transistor cell 204. A metal layer 250 is formed on top of the active edge area 208, in an area marked as 214, to contact a gate 206 via a contact window 240 on the poly finger 206. Referring also to FIGS. 5B and 5C for two cross sectional views along the lines A–A' and B–B' respectively. The MOSFET device is formed on a n+ substrate 205 supporting an n-epitaxial layer 210 where p-body regions 215 are formed on either sides of the poly fingers 206. The poly fingers 206 as shown are covering a thick initial field oxide layer 220. According to the present invention, the polysilicon layer 206 covering the thick oxide layer 220 extend over the edges to form the edge wrap around protective extensions 230. An insulative layer. e.g., a BPSG or PSG layer 235, covering the polysilicon layer 206 with a gate contact metal layer 250 cover the insulative layer 235. As shown in FIG. 5B, the edge wrap-around protective extensions 230 cover the edges of the thick initial oxide layer 220 and extending out with a distance of α covering a thin gate oxide layer 245 thereunder. As that discussed above, the length of the protective extension 230 is shorter than the lateral diffusion length $D_L$ of the body dopant implanted into the body regions 215, i.e., $D_L > \alpha > 0$, as that defined in Equation (1), such that a walk out phenomenon is avoided.

According to FIGS. 5A to 5C, this invention discloses a power transistor 200 disposed on a substrate 205 which includes a core cell area 202 and a termination area 208 opposite the core cell area 202. The core cell area includes a plurality of power transistor cells 204 each having drain 210 and a source 212. Each of the power transistor cells 204 further having a polycrystalline silicon gate 206 disposed on top of the substrate 210. The polycrystalline silicon gate 206 further includes a polycrystalline silicon gate-layer-extension wherein the gate-layer extension extends as a plurality of poly-fingers 206 from the core cell 202 area toward the termination area 208. The power transistor further includes an initial oxide layer 220 disposed under the polycrystalline silicon gate-layer-extension including the poly fingers 206 wherein the polycrystalline gate layer extended over edges of the initial oxide layer 220 to wrap around and cover edges of the initial oxide layer 220 whereby structural damages on edges of the initial oxide layer are reduced. In a preferred embodiment, the power transistor 200 further includes a gate oxide extension layer 245 disposed adjacent to the initial oxide layer 220 padded underneath the polycrystalline gate layer extension 206 having an gate oxide extension width α. The power transistor further includes a body region 215 with a portion disposed under the gate oxide extension layer 245 and the initial oxide layer 220 doped with a body dopant wherein the gate oxide extension width α is shorter than a lateral diffusion length $D_L$ of the body dopant.

In summary, this invention discloses a power transistor disposed on a substrate. This power transistor device includes a core cell area 202 and a termination area 208 opposite the core cell area, the core cell area 202 comprising a plurality of power transistor cells 204 each having a drain 210 and a source, and a gate 206. The power transistor further includes a thin oxide layer 245 disposed on the substrate wherein a portion thereof padded under the dielectric gate 206. The power transistor further includes a thick oxide layer 220 disposed on the substrate having at least a portion disposed adjacent to the thin oxide layer 245 defining a plurality of thick-thin oxide junction points 99 wherein all of the thick-thin oxide junction points 99 on the substrate are covered by a dielectric protection layer 230 thereon. In a preferred embodiment, the dielectric protection layer 230 is a polycrystalline silicon layer. In another preferred embodiment, the dielectric protection layer 206 is an edge wrap around protection layer 230 overlying the thick oxide layer 220 and wrapping around edges thereof for covering the thick-thin junction points 99. In another preferred embodiment, the power transistor further includes a body region 215 doped with a body dopant in the substrate having a portion disposed under the thick oxide layer 220 and a portion under the thin oxide layer 245 wherein the portion under the thin oxide layer 245 having a width α shorter than a lateral diffusion length of the body dopant $D_L$.

According to the above description, this invention also discloses a method of manufacturing a power transistor on a substrate. The method includes the steps of (a) depositing an initial oxide layer on a top surface of the substrate and etching away the initial oxide layer to define an active area includes a core cell area for forming a plurality of transistor cells; (b) growing a gate oxide layer in the active area defining a plurality of thick-thin oxide layer junction points followed by depositing a dielectric gate layer thereon; and (c) patterning the dielectric gate layer for defining a plurality of gates for each of the transistor cells and a plurality of gate layer extension wherein all of the thick-thin oxide junction points on the substrate are covered by the dielectric gate layer thereon. In a preferred embodiment, the step of depositing the dielectric gate layer is a step for depositing a polycrystalline silicon layer. In one of the preferred embodiments, the step of patterning the dielectric gate layer is a step of patterning an edge wrap around protection layer overlying the thick oxide layer and wrapping around edges thereof for covering the thick-thin junction points. In one preferred embodiment, the method further includes a step of forming a body region by implanting a body dopant in the substrate with a portion diffused under the thick oxide layer and a portion under the thin oxide layer wherein the portion under the thin oxide layer having a width shorter than a lateral diffusion length of the body dopant.

Therefore, the present invention provides an improved thick oxide layer structure manufactured by a novel process to overcome the limitations and difficulties encountered in the prior art. Specifically, an improved oxide layer structure is disclosed with a special polysilicon wrapping around edge configuration is formed by employing a specially configured polysilicon mask such that the weak points near the bottom of the thick oxide layer are isolated without becoming contaminated by various processing residuals which may be deposited in the damaged edge surfaces surrounding the thick oxide layer such that device performance and production yield are not adversely affected. Moreover, the length of the wrapping around is precisely controlled such that the weak points near the bottom of the thick oxide layer are isolated and a device walkout problem would not occur by controlling the length of the length of the wrapping around layer over the edge of the thick oxide layer less than a body diffusion length. Also, by precisely controlling the length of the wrapping around extension, the cell size of the MOSFET transistor is not unduly affected whereby the length of the wrapping around edge polysilicon layer does not limit the shrinking of the MOSFET power device to achieve higher cell density. Therefore, the weak points near the bottom of the thick oxide layer are isolated and source to drain leakage current is eliminated without requiring more complicate manufacture process whereby power device with improved reliability and better performance characteristics can be obtained without increasing the production costs.

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

We claim:

1. A power transistor disposed on a substrate comprising:

a core cell area comprising a plurality of power transistor cells each having drain and a source;

each of said power transistor cells further having a polycrystalline silicon gate disposed on top of said substrate;

said polycrystalline silicon gate further includes a polycrystalline silicon gate-layer-extension wherein said gate-layer extension extends as a plurality of poly-fingers away from said core cell area each having a poly-finger-end disposed at a gate-metal area next to said core cell area;

an initial oxide layer disposed in said gate-metal area under said poly-finger-end wherein said poly-fingers having a greater width and length than said initial oxide layer thus covering all edges of said initial oxide layer thereunder.

2. The power transistor of claim 1 further comprising:

a body-dopant region containing impurities of a body dopant disposed in said substrate surrounding said poly-fingers; and said poly-fingers having a length and width exceeding a length and width of said initial oxide layer by a distance α and α is less than a lateral diffusion length $D_L$ of said body dopant.

3. The power transistor of claim 1 further comprising:

a gate oxide layer thinner than said initial oxide layer said gate oxide layer disposed next to said initial oxide layer covered under said poly-fingers thus defining a thin-oxide-thick-oxide interface point between said gate-oxide layer and said initial oxide layer wherein said thin-oxide-thick-oxide interface point is covered under and protected by said poly-fingers having a greater length and width than said initial oxide layer.

4. A power transistor disposed on a substrate comprising:

an initial oxide layer disposed on and surrounding an core cell area comprising a plurality of power transistor cells each having drain and a source on said substrate thus defining a plurality of bottom corners between a top surface of said substrate and a plurality of edge-bottoms of said initial oxide layer;

a polycrystalline silicon layer disposed on top of said initial oxide layer wherein said polycrystalline silicon layer extends over edges of said initial oxide layer thus covering and protecting all of said bottom corners.

5. The power transistor of claim 4 further comprising:

a body-dopant region containing impurities of a body dopant disposed in said substrate surrounding said polycrystalline silicon layer; and said polycrystalline silicon layer having a length and width exceeding edges of said initial oxide layer by a distance $\alpha$ and $\alpha$ is less than a lateral diffusion length $D_L$ of said body dopant.

6. A power transistor disposed on a substrate comprising:

a plurality of power transistor cells each having a drain and a source, and a gate;

a thin gate oxide layer disposed on said substrate wherein a portion thereof padded under said gate;

an initial oxide layer having a thickness greater than said gate oxide layer disposed on said substrate having at least a portion disposed adjacent to said thin gate oxide layer defining a plurality of thick-thin oxide junction points wherein said gate having a gate-extension covering all edges of said initial oxide layer and all of said thick-thin oxide junction points on said substrate.

7. The power transistor of claim 6 wherein:

said gate comprising a polycrystalline silicon layer.

8. The power transistor of claim 6 wherein:

said gate-extension extending beyond edges of said initial oxide layer thus covering said thick-thin junction points.

9. The power transistor of claim 8 further comprising:

a body-dopant region containing impurities of a body dopant disposed in said substrate surrounding said gate and said gate-extension; and said gate-extension extending beyond edges of said initial oxide layer by a distance $\alpha$ and $\alpha$ is less than a lateral diffusion length $D_L$ of said body dopant.

* * * * *